(12) United States Patent
Chang et al.

(10) Patent No.: US 8,421,242 B2
(45) Date of Patent: Apr. 16, 2013

(54) SEMICONDUCTOR PACKAGE

(75) Inventors: Hsiao-Chuan Chang, Kaohsiung (TW); Tsung-Yueh Tsai, Kaohsiung (TW); Yi-Shao Lai, Yonghe (TW); Chang-Lin Yeh, Hsinchu (TW); Ming-Hsiang Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 486 days.

(21) Appl. No.: 12/651,087

(22) Filed: Dec. 31, 2009

(65) Prior Publication Data

US 2011/0156243 A1 Jun. 30, 2011

(51) Int. Cl.
*H01L 23/48* (2006.01)

(52) U.S. Cl.
USPC .................................. 257/777; 257/E23.117

(58) Field of Classification Search ................... 257/777, 257/686, 786, 702, E23.007, E23.116, 685, 257/E23.07
See application file for complete search history.

(56) References Cited

U.S. PATENT DOCUMENTS

| | | | |
|---|---|---|---|
| 6,500,696 B2 | 12/2002 | Sutherland | |
| 6,992,896 B2 | 1/2006 | Fraley | |
| 7,425,760 B1 | 9/2008 | Guenin | |
| 2009/0267238 A1* | 10/2009 | Joseph et al. | 257/777 |
| 2010/0289156 A1* | 11/2010 | Iguchi et al. | 257/777 |

* cited by examiner

*Primary Examiner* — Hoa B Trinh
(74) *Attorney, Agent, or Firm* — Muncy, Geissler, Olds & Lowe, PLLC

(57) ABSTRACT

A semiconductor package is provided. The semiconductor package includes an organic substrate, a stiffness layer, and a chip subassembly. The stiffness layer is formed on the organic substrate. The chip subassembly is disposed on the stiffness layer. The chip subassembly includes at least a first chip, a second chip, and a third chip. The second chip is disposed between the first chip and the third chip in a stacked orientation. The first chip, the second chip, and the third chip have the function of proximity communication.

6 Claims, 5 Drawing Sheets

SEMICONDUCTOR PACKAGE

BACKGROUND OF THE DISCLOSURE

1. Technical Field

The invention relates in general to a package, and more particularly to a semiconductor package.

2. Description of the Related Art

As technologies developing, the size of on-chip structures shrinks and the frequency of on-chip circuit increases, leading to rapid growth in on-chip bandwidth. Similar improvements in the size and speed of off-chip structures are lacking, giving rise to a gap between on-chip and off-chip bandwidth and hence a performance bottleneck.

Proximity communication aims to solve the off-chip bandwidth bottleneck. Proximity communication is based on the observation that faster, lower-cost communication is possible over shorter distances. Placing the transmitter and receiver in extremely close proximity, with only microns of separation between them, should therefore lower overall communication costs. This can be done by placing two chips face-to-face in a manner that aligns the transmitter circuits of one chip with the receiver circuits of the other. The two chips communicate by capacitive coupling, in which transmitters drive a plate of metal on one chip that couples to a corresponding plate of metal on the other chip.

Coplanarity concern is important in the semiconductor package having chip with the function of proximity communication. Conventionally, a ceramic substrate is usually applied in this semiconductor package. In order to cost down, it is a trend to use an organic substrate in stead of the ceramic substrate in some semiconductor package. However, warpage effect arises in the semiconductor package having the organic substrate. Therefore, how to reduce the warpage effect on the organic substrate for coplanarity concern is an important issue to be resolved.

SUMMARY OF THE DISCLOSURE

A semiconductor package is provided. The semiconductor package can reduce the warpage effect on the organic substrate for coplanarity concern.

According to a first aspect of the disclosure, a semiconductor package is provided. The semiconductor package includes an organic substrate, a stiffness layer, and a chip subassembly. The stiffness layer is formed on the organic substrate. The chip subassembly is disposed on the stiffness layer. The chip subassembly includes at least a first chip, a second chip, and a third chip. The second chip is disposed between the first chip and the third chip in a stacked orientation. The first chip, the second chip, and the third chip have the function of proximity communication.

According to a second aspect of the present disclosure, a semiconductor package is provided. The semiconductor package includes an organic substrate, a chip subassembly, and a stiffness layer. The chip subassembly is disposed on the organic substrate. The chip subassembly includes at least a first chip, a second chip, and a third chip. The second chip is disposed between the first chip and the third chip in a stacked and flipped orientation. The first, second, and third chips have the function of proximity communication. The stiffness layer is disposed on the chip subassembly.

The invention will become apparent from the following detailed description of the preferred but non-limiting embodiments. The following description is made with reference to the accompanying drawings.

DETAILED DESCRIPTION OF THE INVENTION

A semiconductor package is disclosed. The semiconductor package includes an organic substrate, a stiffness layer, and a chip subassembly. The stiffness layer is formed on the organic substrate. The chip subassembly is disposed on the stiffness layer. The chip subassembly includes at least a first chip, a second chip, and a third chip. The second chip is disposed between the first chip and the third chip in a stacked orientation. The first chip, the second chip, and the third chip have the function of proximity communication.

Due to the hardness of the organic substrate is less than that of the ceramic substrate, the organic substrate may warp during the process of packaging. By forming the stiffness layer on the organic substrate, the hardness of the organic substrate is increased. Therefore, the warpage effect is reduced and good coplanarity is achieved, which is required by the semiconductor package having chip with the function of proximity communication.

First Embodiment

Figure 1:
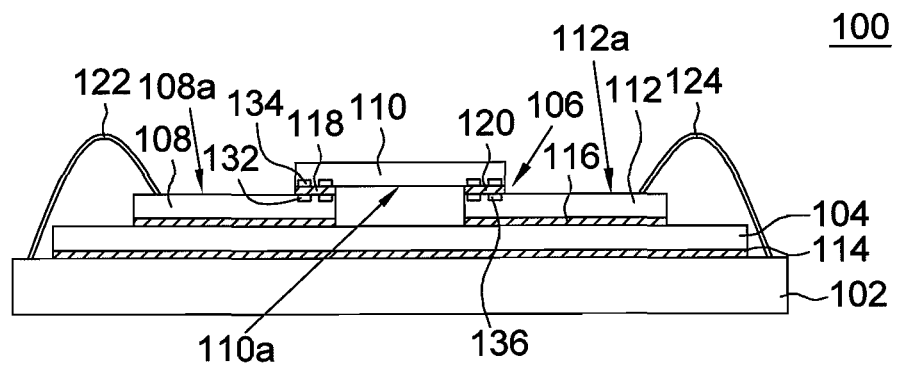
FIG. 1 shows a side view of a semiconductor package according to a first embodiment of the disclosure.

Referring to FIG. 1, a side view of a semiconductor package 100 according to a first embodiment of the disclosure is illustrated. The semiconductor package 100 includes an organic substrate 102, a stiffness layer 104, and a chip subassembly 106. The stiffness layer 104 is formed on the organic substrate 102. The chip subassembly 106 is disposed on the stiffness layer 104. The chip subassembly 106 includes at least a first chip 108, a second chip 110, and a third chip 112. The second chip 110 is disposed between the first chip 108 and the third chip 112 in a stacked orientation. The first chip 108, the second chip 110, and the third chip 112 have the function of proximity communication.

For example, the stiffness layer 104 is attached on the organic substrate 102 through the adhesion layer 114. The chip subassembly 106 is attached on the stiffness layer 104 through the adhesion layer 116. The second chip 110 is connected to the first chip 108 and the third chip 112 through the adhesion layers 118 and 120 respectively. The first chip 108 and the third chip 112 are electrically connected to the organic substrate 102 by the bonding wires 122 and 124, respectively.

In order to achieve the function of proximity communication in the chips 108, 110, and 112 of the chip subassembly 106, part of the chips 108 and 110 and part of the chips 110 and 112 are placed face-to-face in a manner that aligns the transmitter circuit of one chip with the receiver circuit of the other in extremely close proximity, for example, with only microns of separation between them. The signals between the transmitter circuit and the receiver circuit are transmitted by capacitive coupling or inductively coupling with low overall communication cost.

For example, the first chip 108 has first signal pads 132 formed on a major surface 108a of the first chip 108, the second chip 110 has second signal pads 134 formed on a major surface 110a of the second chip 110, and the third chip 112 has third signal pads 136 formed on a major surface 112a of the third chip 112. The second chip 110 are arranged in face-to-face manner with the first chip 108 and the third chip 112 so that at least some of the second signal pads 134 are capacitively coupled to at least some of the first signal pads 132 and at least some of the third signal pads 136. The major surface 110a of the second chip 110 is spaced apart from the major surface 108a of the first chip 108 and the major surface 112a of the third chip 112.

Take transmission by capacitive coupling for example. Part of the second signal pads 134 of the second chip 110 and the first signal pads 132 of the first chip 108 are aligned with each other, and part of the second signal pads 134 of the second chip 110 and the third signal pads 136 of the third chip 112 are aligned with each other. Since the pads are not in physical contact with each other, there are capacitances between the first signal pads 132 and the second signal pads 134, and between the second signal pads 134 and the third signal pads 136. It is this capacitive coupling that provides signal paths between the first chip 108 and the second chip 110 and between the second chip 110 and the third chip 112. Changes in the electrical potential of the surface metal of a signal pad cause corresponding changes in the electrical potential of the metal comprising the corresponding signal pad. Suitable drivers of the transmitter circuit and sensing circuits of the receiver circuit in the respective chip make communication through this small capacitance possible.

Figure 2A:
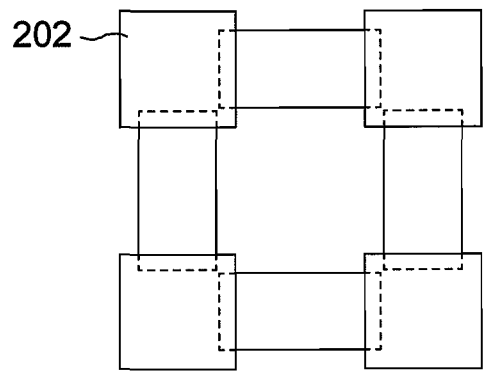
FIG. 2A shows the chip subassembly having eight chips arranged in 2 by 2 matrix, which may be included in the semiconductor package in FIG. 1.
Figure 2B:
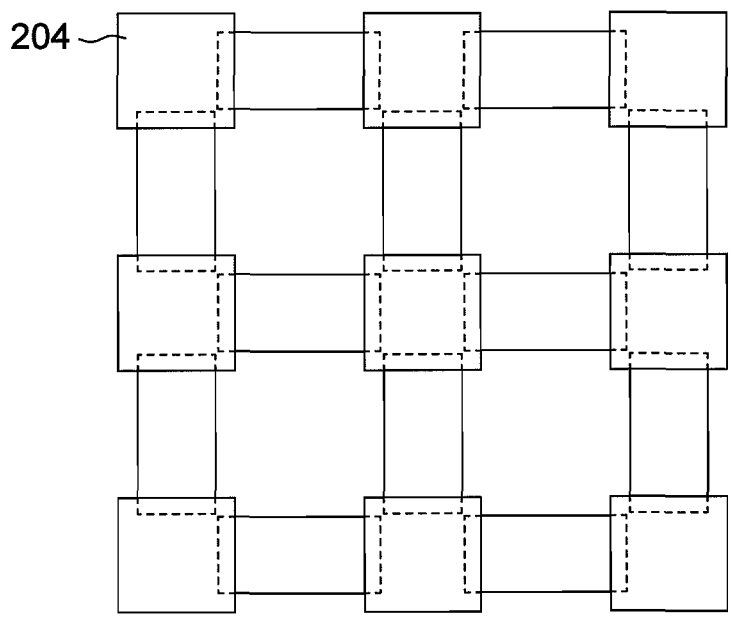
FIG. 2B shows the chip subassembly having eight chips arranged in 3 by 3 matrix, which may be included in the semiconductor package in FIG. 1.

The semiconductor package can also have a chip subassembly having a number of chips arranged in matrix, for example, the chips arranged in matrix as shown in FIG. 2A or FIG. 2B. In FIG. 2A, the chip subassembly has eight chips 202 arranged in 2 by 2 matrix. In FIG. 2B, the chip subassembly has twenty one chips 204 arranged in 3 by 3 matrix. Two adjacent chips are partially overlapped to each other in stacked relation for the function of proximity communication.

The material of the stiffness layer 104 can be implemented by Silicon carrier or can be made of other material of high hardness, for example, be made of metal. By forming the stiffness layer 104 on the organic substrate 102, the organic substrate 102 will tend not to warp during the process of manufacture or during the operation of the semiconductor package 100. Therefore, the organic substrate 102 will have good coplanarity, which makes the chips 108, 110, and 112 function properly in the proximity communication.

Second Embodiment

Figure 3:
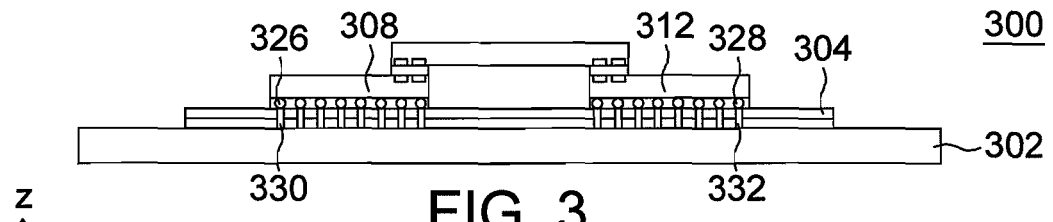
FIG. 3 illustrates a side view of a semiconductor package according to a second embodiment of the disclosure.

Referring to FIG. 3, a side view of a semiconductor package 300 according to a second embodiment of the disclosure is illustrated. The difference between semiconductor package 100 of the first embodiment and the semiconductor package 300 of the second embodiment are described as follows. Each of the first chip 308 and the third chip 312 has a number of electric contacts, for example, bumps 326 and 328. The stiffness layer 304 has a number of vias 330 and 332. The bumps 326 of the first chip 308 and the bumps 328 of the third chip 312 are electrically connected to the organic substrate 312 by the vias 330 and 332 respectively, by which the first chip 308 and third chip 312 are electrically connected to the organic substrate 302.

Third Embodiment

Figure 4A:
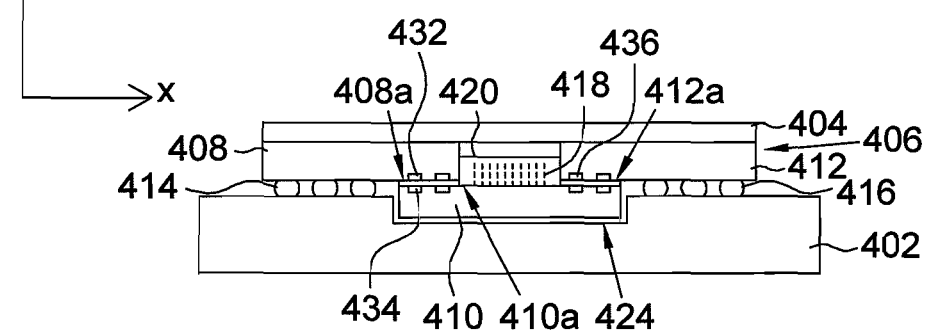
FIG. 4A shows a side view of a semiconductor package according to a third embodiment of the disclosure.
Figure 4B:
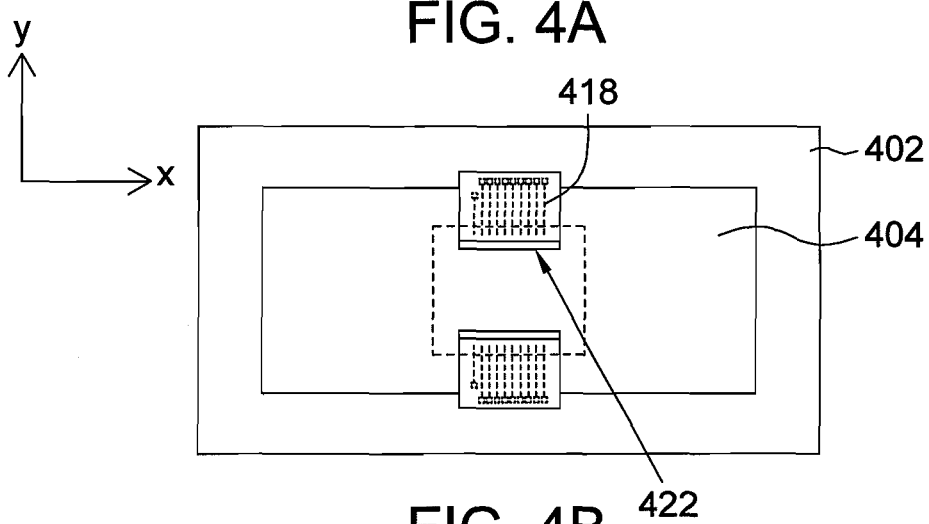
FIG. 4B shows the top view of the semiconductor package in FIG. 4A.

Referring to FIG. 4A and FIG. 4B, a side view of a semiconductor package 400 according to a third embodiment of the disclosure is illustrated in FIG. 4A and the top view of the semiconductor package 400 is illustrated in FIG. 4B. The semiconductor package 400 includes an organic substrate 402, a chip subassembly 406, and a stiffness layer 404. The chip subassembly 406 is disposed on the organic substrate 402. The chip subassembly 406 includes at least a first chip 408, a second chip 410, and a third chip 412. The second chip 410 is disposed between the first chip 408 and the third chip 412 in a stacked and flipped orientation. The first, second, and third chips 408, 410, and 412 have the function of proximity communication. The stiffness layer 404 is disposed on the chip subassembly 406.

For example, the first chip 408 has first signal pads 432 formed on a major surface 408a of the first chip 408, the second chip 410 has second signal pads 434 formed on a major surface 410a of the second chip 410, and the third chip 412 has third signal pads 436 formed on a major surface 412a of the third chip 412. The second chip 410 are arranged in face-to-face manner with the first chip 408 and the third chip 412 so that at least some of the second signal pads 434 are capacitively coupled to at least some of the first signal pads 432 and at least some of the third signal pads 436. The major surface 410a of the second chip 410 is spaced apart from the major surface 408a of the first chip 408 and the major surface 412a of the third chip 412.

The first chip 408 has a number of bumps 414 with which the first chip 408 is electrically connected to the organic substrate 402. The third chip 412 has a number of bumps 416 with which the third chip 412 is electrically connected to the organic substrate 402. The second chip 410 has a number of bonding wires 418 with which the second chip 410 is electrically connected to the organic substrate 402. A sealant 420 is formed on the second chip 410 and covers the bonding wires 418. The stiffness layer 404 has at least one opening 422 whose position is corresponding to the position of the bonding wires 418.

Furthermore, the organic substrate 402 has a cavity 424 for receiving the second chip 410 for reducing the thickness of the semiconductor package 400. The stiffness layer 404 may be implemented by a lid, for example, a metal lid. The lid made of aluminum or stainless steel is preferred.

Figure 5A:
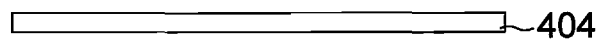
FIG. 5A to FIG. 5I show the method for manufacturing the semiconductor package in FIG. 4A and FIG. 4B.
Figure 5B:
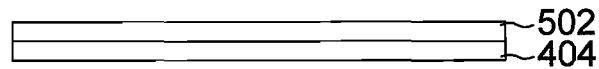
Figure 5C:
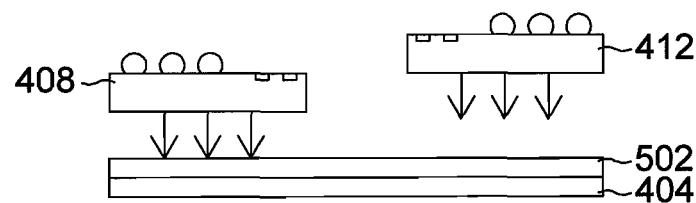
Figure 5D:
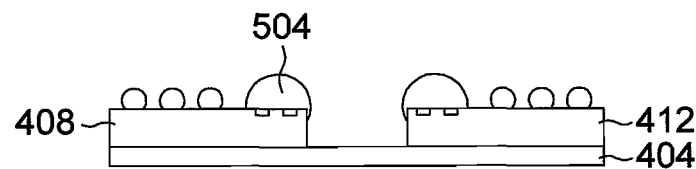

Referring to FIG. 5A to FIG. 5I, the method for manufacturing the semiconductor package 400 is shown. Firstly, the stiffness layer 404 is provided, as shown in FIG. 5A. Next, a tape 502 is attached on the stiffness layer 404, or glue is dispensed on the stiffness layer 404, as shown in FIG. 5B. After that, the first chip 408 and the third chip 412 are picked and placed on the tape 502, as shown in FIG. 5C. Then, glue 504 is dispensed on the first chip 408 and the third chip 412, as shown in FIG. 5D.

Figure 5E:
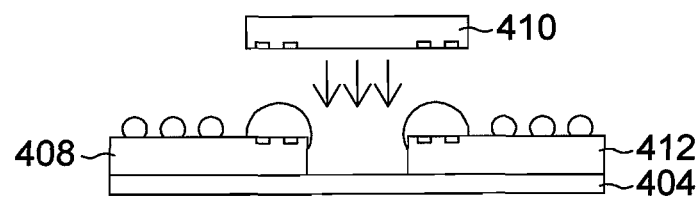
Figure 5F:
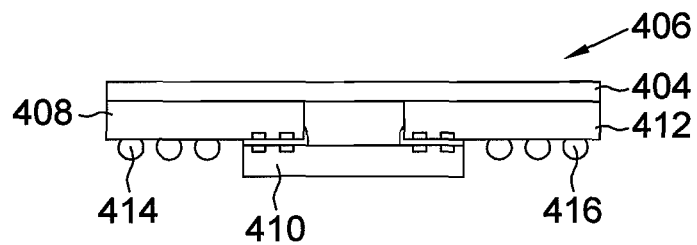
Figure 5G:
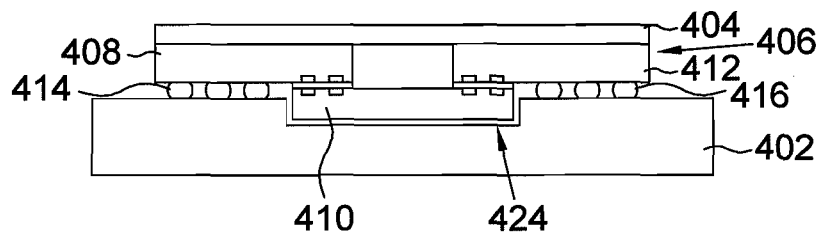
Figure 5H:
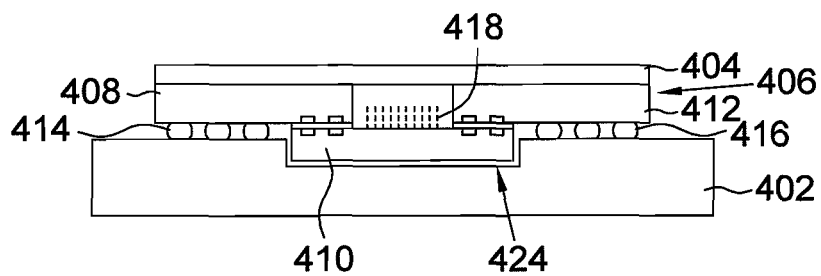
Figure 5I:
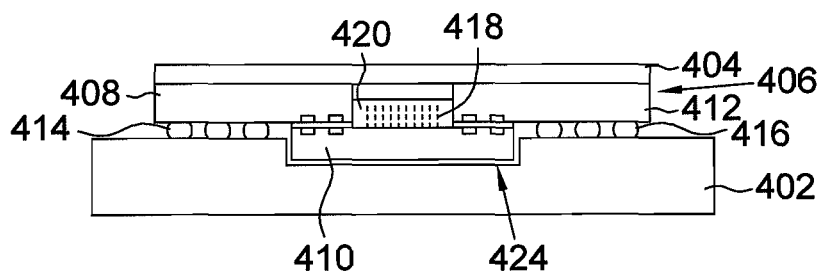

Next, the second chip 410 is picked and placed on the first chip 408 and the third chip 412 to form the chip subassembly 406, as shown in FIG. 5E. Then, the chip subassembly 406 is flipped over, as shown in FIG. 5F. After that, the chip subassembly 406 is bonded to the organic substrate 402, as shown in FIG. 5G. Then, wire bonding is performed, as shown in FIG. 5H, and sealant 420 is formed to cover the bonding wires 418 and form the semiconductor package 400, as shown in FIG. 5I.

Figure 4C:
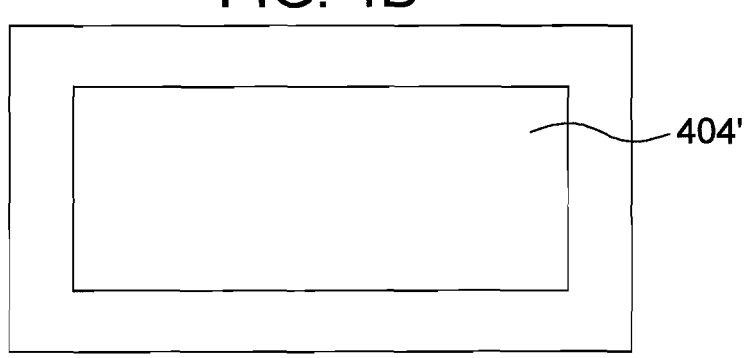
FIG. 4C shows another top view of the semiconductor package without bonding wires.

The second chip 410 can be electrically connected to the organic substrate 402 by other elements, instead of the bonding wires 418. If the bonding wires 418 are omitted, the sealant 420 and the opening 422 are not necessary for the semiconductor package 400. FIG. 4C shows an example of the semiconductor package without bonding wires. The stiffness layer 404' in FIG. 4C is substantially rectangular.

The semiconductor package 400 of this embodiment can also reduce the wrapage effect of the organic substrate 402. Furthermore, the stiffness layer 404 can avoid the break of the second chip 410. Without the stiffness layer 404, the second chip 410 may be broken due to the non-equalized stress applied on second chip 410, or on the first chip 408 and the third chip 412. The second chip 412 may also be broken due to the tilt of chip subassembly 406 during being placed on the organic substrate 402 or be broken during other handing for the chip subassembly 406. The stiffness layer 404 can protect the chip subassembly 406, and the probability of the break of the second chip 410 is reduced.

Fourth Embodiment

Figure 6:
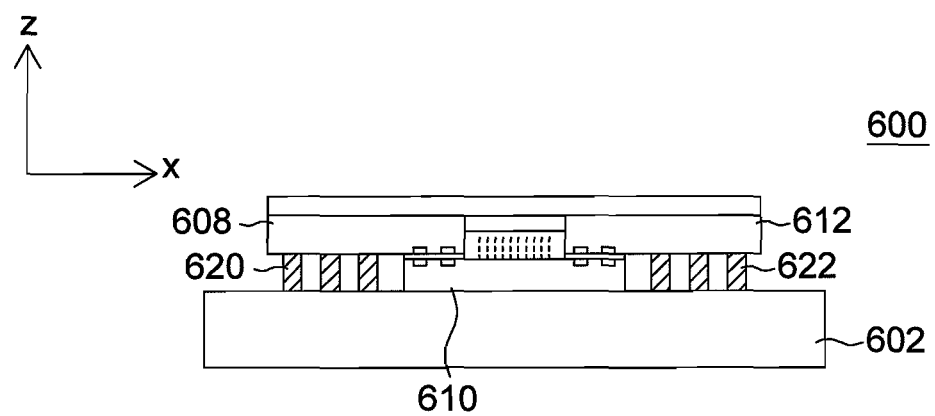
FIG. 6 illustrates a side view of a semiconductor package according to a fourth embodiment of the disclosure.

Referring to FIG. 6, a side view of a semiconductor package 600 according to a fourth embodiment of the disclosure is illustrated. The difference between semiconductor package 400 of the third embodiment and the semiconductor package 600 of the fourth embodiment are described as follows. The organic substrate 602 of the semiconductor package 600 does not have cavity, and the second chip 610 touches the organic substrate 602. Besides, the first chip 608 has a number of metal pillars 620 with which the first chip 608 is electrically connected to the organic substrate 602. The third chip 612 has a number of metal pillars 622 with which the third chip 612 is electrically connected to the organic substrate 602. The height of the metal pillars 620 and 622 are substantially equal to the height of the second chip 610.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
   an organic substrate;
   a chip subassembly, disposed on the organic substrate, the chip subassembly comprising at least a first chip, a second chip, and a third chip, the second chip being disposed between the first chip and the third chip in a stacked and flipped orientation, the second chip supporting proximity communication between the first chip and the third chip; and
   a stiffness layer, disposed on the chip subassembly;
   wherein the second chip has a plurality of bonding wires with which the second chip is electrically connected to the organic substrate, and the stiffness layer has at least one opening whose position is corresponding to the position of the bonding wires.

2. The semiconductor package according to claim 1, wherein each of the first chip and the third chip has a plurality of bumps with which the first chip and third chip are electrically connected to the organic substrate.

3. The semiconductor package according to claim 1, wherein the organic substrate has a cavity for receiving the second chip.

4. The semiconductor package according to claim 1, wherein each of the first chip and the third chip has a plurality of metal pillars with which the first chip and the third chip are electrically connected to the organic substrate, the height of the metal pillars are substantially equal to the height of the second chip.

5. The semiconductor package according to claim 1, wherein:
   the first, second and third chips respectively have first, second and third signal pads formed on a major surface thereof;
   the second chip are arranged in face-to-face manner with the first chip and the third chip so that at least some of the second signal pads are capacitively coupled to at least some of the first signal pads and at least some of the third signal pads;
   the major surface of the second chip is spaced apart from the major surfaces of the first and third chips.

6. The semiconductor package according to claim 1, wherein a sealant is formed to cover the bonding wires.

* * * * *